United States Patent
Lee et al.

(10) Patent No.: US 11,482,552 B2
(45) Date of Patent: Oct. 25, 2022

(54) SEMICONDUCTOR DEVICES AND METHODS FOR FORMING THE SAME

(71) Applicant: Vanguard International Semiconductor Corporation, Hsinchu (TW)

(72) Inventors: Hsin-Hui Lee, Kaohsiung (TW); Han-Liang Tseng, Hsinchu (TW); Hsueh-Jung Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/685,588

(22) Filed: Nov. 15, 2019

(65) Prior Publication Data
US 2021/0151489 A1    May 20, 2021

(51) Int. Cl.
*H01L 27/146*    (2006.01)

(52) U.S. Cl.
CPC .... *H01L 27/14623* (2013.01); *H01L 27/1462* (2013.01); *H01L 27/14643* (2013.01); *H01L 27/14685* (2013.01)

(58) Field of Classification Search
CPC ........... H01L 27/14623; H01L 27/1462; H01L 27/14643; H01L 27/14685
See application file for complete search history.

(56) References Cited

U.S. PATENT DOCUMENTS

| | | | | |
|---|---|---|---|---|
| 6,939,015 B2* | 9/2005 | Hodge | ............ | H01L 31/02164 |
| | | | | 257/E31.122 |
| 2004/0180461 A1* | 9/2004 | Yaung | ............ | H01L 27/14685 |
| | | | | 438/48 |
| 2016/0372142 A1* | 12/2016 | Biskeborn | ............ | G11B 5/3106 |
| 2017/0169273 A1* | 6/2017 | Wu | .................... | G06K 9/00087 |
| 2018/0066982 A1* | 3/2018 | Peng | .................... | G01J 1/0407 |
| 2019/0096820 A1* | 3/2019 | Liou | .................... | H01L 23/5329 |
| 2019/0386048 A1* | 12/2019 | Lee | .................... | G06K 9/0004 |

FOREIGN PATENT DOCUMENTS

| | | |
|---|---|---|
| EP | 1401025 A2 | 3/2004 |
| JP | 2010-177418 A | 8/2010 |
| TW | 201911111 A | 3/2019 |

OTHER PUBLICATIONS

Taiwanese Office Action and Search Report, dated Jul. 21, 2020, for Taiwanese Application No. 108135620.

* cited by examiner

Primary Examiner — Dale E Page
Assistant Examiner — Quovaunda Jefferson
(74) Attorney, Agent, or Firm — Birch, Stewart, Kolasch & Birch, LLP

(57) ABSTRACT

A method for forming a semiconductor device is provided. The method includes forming a sensor pixel array in a substrate, forming several transparent pillars over the substrate, and forming a light shielding layer over the substrate to cover the transparent pillars. The sensor pixel array has several sensor pixels, and each of the transparent pillars is correspondingly disposed on one of the sensor pixels of the sensor pixel array. The light shielding layer is a multi-layer structure. The method further includes performing a planarization process to expose the top surface of the transparent pillars.

19 Claims, 5 Drawing Sheets

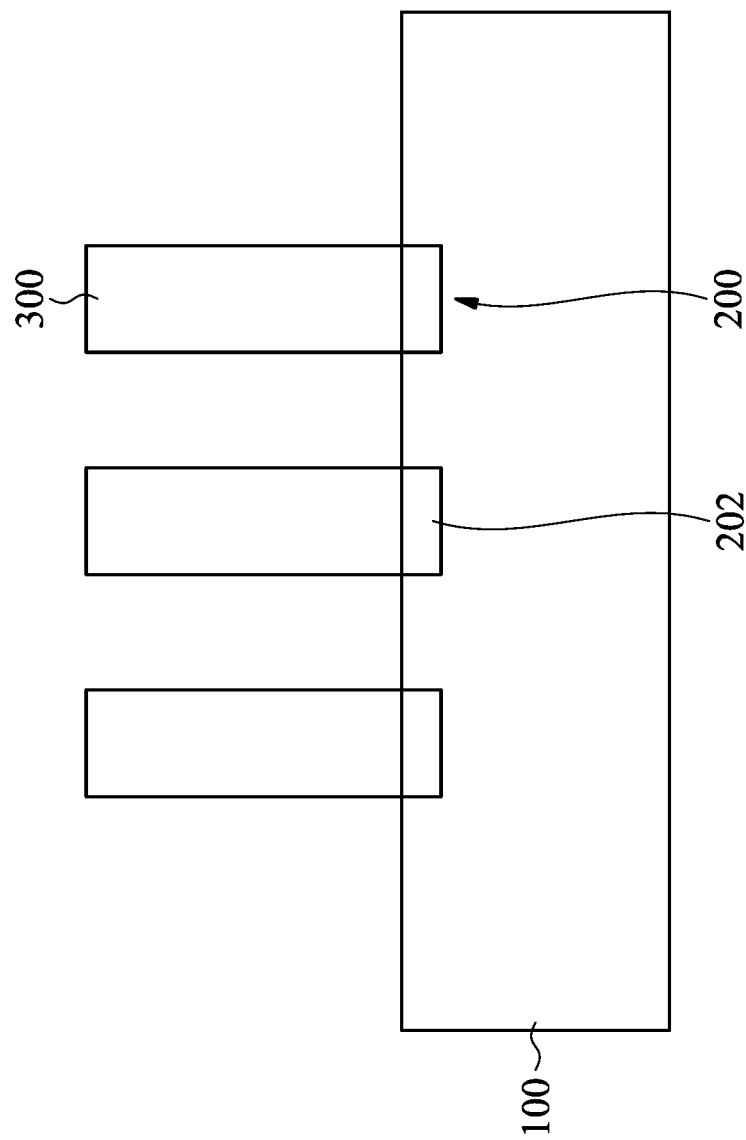

SEMICONDUCTOR DEVICES AND METHODS FOR FORMING THE SAME

BACKGROUND

Technical Field

The disclosure relates to semiconductor devices, and more particularly to optical sensing structures and methods for forming the same.

Description of the Related Art

Today's mobile devices (such as cell phones, tablet computers, and laptop computers) are equipped with user-recognition systems to provide access control and protect personal information security. Each person has unique fingerprints. Therefore, fingerprint sensors are a common and reliable recognition system for users.

Most commercially available fingerprint sensors used to recognize the fingerprints of users are based on optical sensing technologies. An optical sensor used as a fingerprint recognition device may be formed of a large number of optical elements, and it may include a light collimator, a beam splitter, a focus lens, and a linear sensor. The function of the light collimator is to collimate light to reduce power loss caused by light divergence.

Although existing optical sensors have been generally adequate for their intended purposes, they have not been entirely satisfactory in all respects. In particular, increasing the yield of production and reliability of products still needs further improvement.

SUMMARY

Some embodiments of the present disclosure provide a method for forming semiconductor devices. The method includes forming a sensor pixel array in a substrate, forming a plurality of transparent pillars over the substrate, and forming a light shielding layer over the substrate to cover the transparent pillars. The sensor pixel array includes a plurality of sensor pixels, and each of the transparent pillars is correspondingly disposed on one of the sensor pixels of the sensor pixel array. Also, the light shielding layer as described above is a multi-layer structure. The method further includes performing a planarization process to expose top surfaces of the transparent pillars.

Some embodiments of the present disclosure provide a semiconductor device. A semiconductor device includes a sensing pixel array in a substrate, a plurality of transparent pillars over the substrate, and a light shielding layer over the substrate and between the transparent pillars. The sensing pixel array includes a plurality of sensing pixels. Each of the transparent pillars is correspondingly disposed on one of the sensing pixels of the sensing pixel array. Also, the light shielding layer as described above is a multi-layer structure.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein:

FIG. 1A to FIG. 1C are cross-sectional views illustrating intermediate stages of an exemplary method for forming the semiconductor device 10 of FIG. 1C in accordance with some embodiments.

DETAILED DESCRIPTION

Figure 1B:
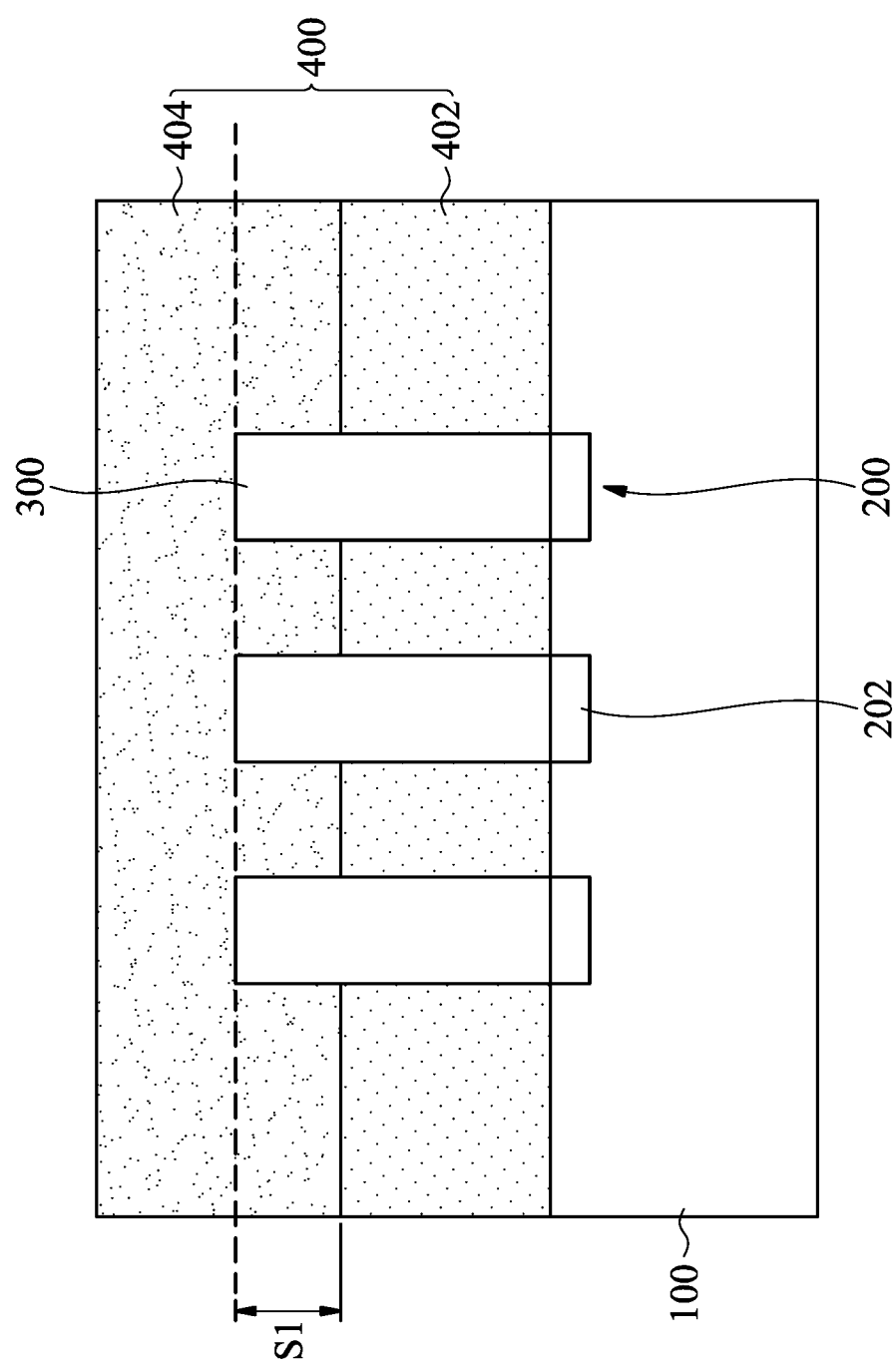

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The terms "about", "approximately", and "substantially" used herein generally refer to a value of an error or a range within 20 percent, preferably within 10 percent, and more preferably within 5 percent, within 3 percent, within 2 percent, within 1 percent, or within 0.5 percent. If there is no specific description, the mentioned values are regarded as an approximation that is the error or the range expressed as "about", "approximate", or "substantially".

Some variations of the example methods and structures are described. Persons having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of the components or features illustrated therein may be omitted to avoid obscuring other components or features; this is for ease of depicting the figures.

Embodiments of semiconductor device and methods for forming the same especially suited for an optical sensor having a light collimating layer are provided. In some embodiments of the present disclosure, a light shielding layer filling the spaces between the transparent pillars is provided, wherein the light shielding layer is configured as a multi-layer structure. Accordingly, the embodiments of the disclosure solve the collapsing problem (caused by the light shielding layer being too soft) or prevent cracks on the surface of the light shielding layer (caused by the light shielding layer being too rigid) after the planarization process is performed. Thus, according to some embodiments, the reliability of the semiconductor device and yield of production can be significantly improved.

Figure 1C:
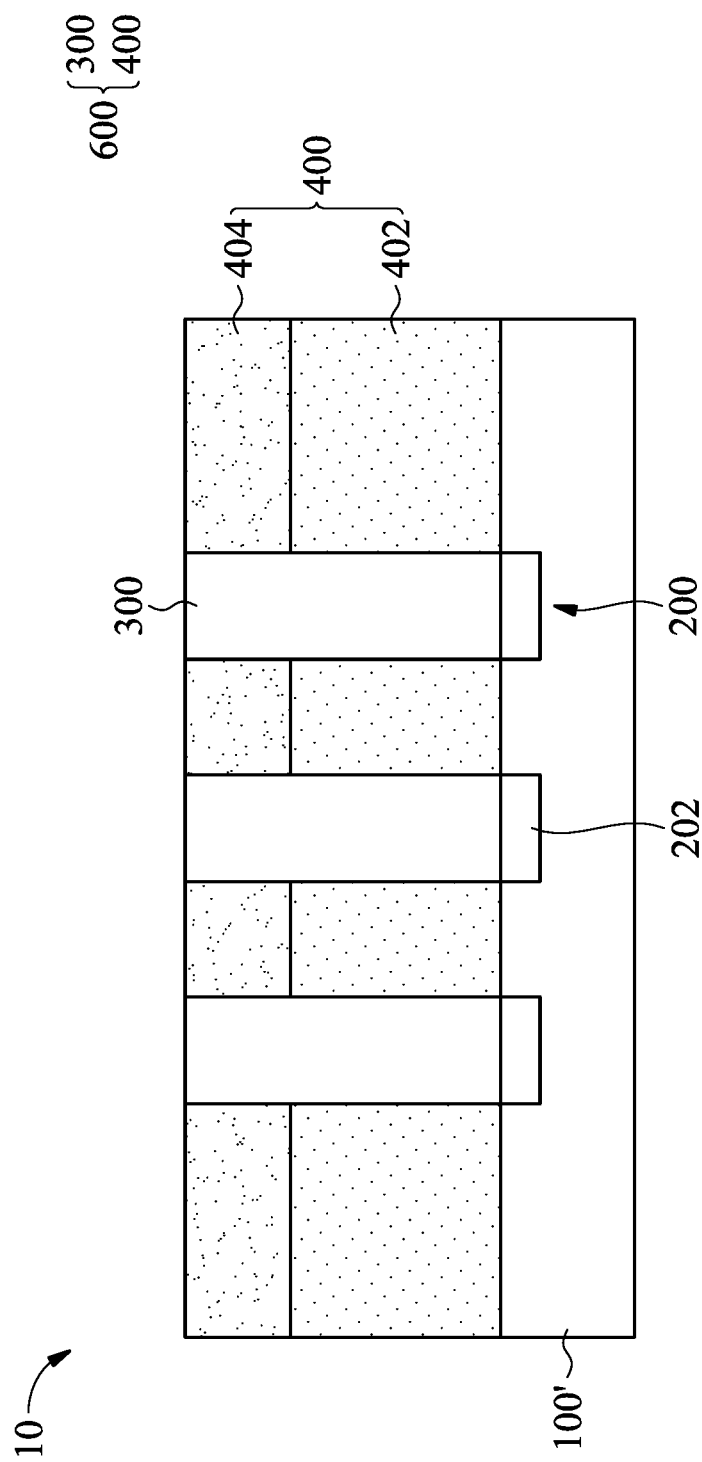

FIG. 1A to FIG. 1C are cross-sectional views illustrating intermediate stages of an exemplary method for forming the semiconductor device 10 of FIG. 1C in accordance with some embodiments.

FIG. 1A illustrates an initial step of a method for forming the semiconductor device 10 according to an embodiment of the present disclosure. As shown in FIG. 1A, a substrate 100 is provided. In one embodiment, the substrate 100 may be a silicon substrate, a silicon germanium (SiGe) substrate, a compound semiconductor substrate, a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is generally provided on a silicon substrate or a glass substrate. Other substrates, such as a multi-layered or gradient substrate may also be used. In some embodiments, the semiconductor material of the semiconductor substrate may include elementary semiconductors including silicon (Si) or germanium (Ge); compound semiconductors including silicon carbide (SiC), gallium arsenide (GaAs), gallium phosphide (GaP), indium phosphide (InP), indium arsenide (InAs), or indium antimonide (InSb); alloy semiconductors including SiGe alloy, GaAsP alloy, AlInAs alloy, AlGaAs alloy, GaInAs alloy, GaInP alloy, or GaInAsP alloy; or a combination thereof In some embodiments, the substrate 100 may include various isolation features (not shown) which are used to define active regions in/on the substrate 100, wherein the isolation features also isolate the components in the active regions. In some embodiments, the isolation features may include shallow trench isolation (STI) features, local oxidation of silicon (LOCOS) features, other suitable isolation features, or a combination thereof.

In some embodiments, the substrate 100 may include various features of the semiconductor device, and those features may include transistors, diodes, other suitable features, or a combination thereof. For example, the transistors may include metal oxide semiconductor field effect transistor (MOSFET), complementary metal oxide semiconductor (CMOS), bipolar junction transistors (BJT), high-voltage transistors, high-frequency transistors, p-channel and/or n-channel field effect transistors (PFETs/NFETs), etc.

In some embodiments, the substrate 100 may include various conductive features, such as conductive lines or conductive vias (not shown). For example, the above conductive features may be made of aluminum (Al), copper (Cu), tungsten (W), other suitable conductive materials, an alloy thereof, or a combination thereof.

As shown in FIG. 1A, a sensing pixel array 200 is formed in the substrate 100, and the sensing pixel array 200 includes several sensing pixels 202, in accordance with some embodiments. The sensing pixels 202 are electrically connected to a signal process circuitry (not shown). In some embodiments, the number of sensing pixels 202 in the sensing pixel array 200 is determined based on the size of the optical sensing area. Each of the sensing pixels 202 may include one or more photodetectors. In some embodiments, a photodetector may include photodiodes. A photodiode may include P-type semiconductor layer, an intrinsic layer, and a photoelectric material structure of tri-layered N-type semiconductor layers. Light absorbed in the intrinsic layer generates excitons, and the excitons are divided into electrons and holes at the interface between the P-type semiconductor layer and the N-type semiconductor layers, thereby generating electronic signal. In some other embodiments, the photodetector may also include charged coupling device (CCD) sensors, complimentary metal-oxide-semiconductor (CMOS) image sensors, active sensors, passive sensors, other suitable sensors, or a combination thereof. In some embodiments, the sensing pixels 202 convert the optical signals as received into an electronic signal by the photodetector, and the electronic signal is processed by the signal process circuitry. It should be noted that the number and arrangement of the sensing pixels 202 of the sensing pixel array 200 shown in FIG. 1A are provided merely for illustration. The actual number and arrangement of the sensing pixels 202 are not limited thereto. According to the embodiments of the disclosure, the sensing pixels 202 can be in an array with any number of rows and columns, or in another arrangement.

Also referring to FIG. 1A, several transparent pillars 300 are formed over the sensing pixel array 200. Each of the transparent pillars 300 is correspondingly disposed on one of the sensing pixels 202. In some embodiments, a transparent material layer (not shown) is blanketly formed on the substrate 100 to cover the sensing pixel array 200. In some embodiments, the transparent material layer may include a transparent material having a transmittance greater than about 90% for light having a wavelength between 300 nm and 1200 nm, thereby allowing a portion of the incident light to pass through the transparent material layer and reach the sensing pixels 202.

In some embodiments, the transparent material layer may include a photocuring material, a UV-curable material, a thermosetting material, or a combination thereof. For example, the transparent material layer may include poly (methyl methacrylate)(PMMA), polyethylene terephthalate (PET), polyethylene naphthalate (PEN), polycarbonate (PC), perfluorocyclobutane (PFCB) polymer, polyimide (PI), acrylic resin, epoxy resins, polypropylene (PP), polyethylene (PE), polystyrene (PS), polyvinyl chloride (PVC), another suitable material, or a combination thereof. In some embodiments, the transparent material layer may be deposited on the substrate 100 by spin coating, casting, bar coating, blade coating, roller casting, wire bar coating, dip coating, chemical vapor deposition (CVD), another suitable method, or a combination thereof. In some embodiments, the thickness of the transparent material layer formed using the aforementioned methods is in a range between about 10 μm and about 300 μm, such as about 100 μm. In some other embodiments, the thickness of the transparent material layer is in a range between about 100 μm and about 500 μm, such as about 300 μm.

Next, the transparent material layer on the substrate 100 is selectively removed to form transparent pillars 300, as shown in FIG. 1A. In some embodiments, since the transparent pillars 300 are disposed on the sensing pixels 202 correspondingly, the transparent pillars 300 can protect the sensing pixels 202 and prevent the sensing pixels 202 from contamination and/or damage during processing, thereby maintaining or improving the sensitivity of the semiconductor device 10. In some embodiments, each of the transparent pillars 300 is correspondingly disposed on one of the sensing pixels 202, as shown in FIG. 1A. In some other embodiments, at least one of the transparent pillars 300 covers two or more of the sensing pixels 202 (not shown). In some embodiments, in the top view, the transparent pillars 300 may have a circular shape, a rectangular shape, a polygonal shape, any shape, or a combination of different shapes, and can be arranged as an array (not shown).

In some embodiments, the transparent material layer may be selectively removed by a patterning process to form the transparent pillars 300. In some embodiments, the patterning process includes a photolithography process and an etching process if the transparent material layer is a non-photoresist material. In some embodiments, the photolithography process may include photoresist coating (e.g., spin-on coating), soft baking, pattern exposure, post-exposure baking, development, rinsing and drying (e.g., hard baking), other suitable techniques, or a combination thereof. The etching process may include a wet etching process, a dry etching process (e.g., reactive ion etch (RIE), plasma etching, or ion milling), other suitable processes, or a combination thereof.

In some other embodiments where the transparent material layer is a photoresist material, the transparent pillars 300 may be directly formed by patterning the transparent material layer using a photolithography process without additional etching process. This photolithography process mentioned herein is similar to the photolithography process mentioned above, and the details are not repeated herein.

In some embodiments, the transparent pillars 300 formed by aforementioned methods have a thickness in a range between about 5 μm and about 300 μm, such as about 100 μm. In some other embodiments, the thickness of the transparent pillars 300 is in a range between about 50 μm and about 500 μm, such as about 300 μm. In some embodiments, top surfaces of the transparent pillars 300 are substantially leveled with each other. In some embodiments, the ratio of height to width (i.e. aspect ratio) of the transparent pillars 300 is in a range between about 2 and about 30, such as about 5, about 10, about 15 or about 20. If the transparent pillars 300 are too high (i.e. the aspect ratio is too large), the transparent pillars 300 tend to deform or collapse, which leads to an increase in process difficulty and production cost. If the transparent pillar 300 is too wide (i.e. the aspect ratio is too small), it is easy to receive unnecessary incident light and difficult to achieve the collimating effect, thereby reducing the sensitivity of the semiconductor device 10.

FIG. 1B depicts formation of a light shielding layer 400, wherein the light shielding layer 400 is a multi-layer structure. For example, the light shielding layer 400 includes a bottom light shielding layer 402 and a top light shielding layer 404. Formation of the light shielding layer can be conducted by forming a bottom light shielding layer 402 over the substrate 100, and forming a top light shielding layer 404 on the bottom light shielding layer 402. The bottom light shielding layer 402 and the top light shielding layer 404 fill spaces between the transparent pillars 300, and the top light shielding layer 404 covers the top surfaces of the transparent pillars 300. The top light shielding layer 404 protects the transparent pillars 300 from damages during a subsequent planarization process.

In some embodiments, the light shielding layer 400 (such as the bottom light shielding layer 402 and the top light shielding layer 404) may include a material having a lower transmittance than about 1% for light having a wavelength of 300 nm to 1200 nm, thereby leading the light to reach the corresponding sensing pixels 202 accurately. In some embodiments, a hardness of the light shielding layer 400 (such as the bottom light shielding layer 402 and the top light shielding layer 404) is greater than a hardness of the transparent pillars 300 so the transparent pillars 300 can be protected from subsequent processes. In some embodiments, the Mohs' hardness of the transparent pillars 300 is in a range between about 1.5 and about 2.5, such as about 2.0. Also, in some embodiments, the Mohs' hardness of each of the light shielding layer 400 (such as the bottom light shielding layer 402 and the top light shielding layer 404) is in a range between about 1.5 and about 9.0, such as about 2.5 and 7.0.

In the subsequent processes, the transparent pillars 300 on the sensing pixels 202 and the light shielding layer 400 between the transparent pillars 300 together form a light collimating layer 600 (details will be described later).

In some embodiments, the bottom light shielding layer 402 and the top light shielding layer 404 of the light shielding layer 400 as formed have different hardness. Generally, if the light shielding layer 400 is too soft, the light shielding layer 400 tends to collapse after the planarization process is performed. If the light shielding layer 400 is too rigid, cracks are easily generated on the surface of the light shielding layer 400. In some embodiments of this disclosure, the light shielding layer 400 is a multi-layer structure, and those layers have different hardness, thereby solving the problem of collapse or cracks formed on the surface of the light shielding layer 400 after the planarization process is performed. In some embodiments, a difference between the Mohs' hardness of the bottom light shielding layer 402 and the Mohs' hardness of the top light shielding layer 404 is between about 2 and about 6, such as about 4. In some embodiments, the hardness of the bottom light shielding layer 402 is less than the hardness of the top light shielding layer 404. For example, the Mohs' hardness of the bottom light shielding layer 402 is about 3, and the Mohs' hardness of the top light shielding layer 404 is about 4. In some other embodiments, the hardness of the bottom light shielding layer 402 is greater than the hardness of the top light shielding layer 404. For example, the Mohs' hardness of the bottom light shielding layer 402 is about 4, and the Mohs' hardness of the top light shielding layer 404 is about 3.

In some embodiments, the bottom light shielding layer 402 and the top light shielding layer 404 may include different materials. In some embodiments, the bottom light shielding layer 402 and/or the top light shielding layer 404 may include a photoresist (such as a black photoresist or other suitable opaque photoresists), an ink (such as a black ink or other suitable opaque inks), a molding compound (such as a black molding compound or other suitable opaque molding compounds), a solder mask (such as a black solder mask or other suitable opaque solder masks), another suitable material, or a combination thereof. In some embodiments, the light shielding layer 400 may include photocuring material, thermal curing material, or a combination thereof. In some embodiments, the light-shielding materials of the bottom light shielding layer 402 and the top light shielding layer 404 may be sequentially coated or dispensed on the substrate 100. Therefore, the light-shielding material fully covers the transparent pillars 300 and fills spaces between the transparent pillars 300. Then, the light-shielding materials are cured by performing a curing process thereby forming the light shielding layer 400. For example, the curing process may include a photocuring process, a thermal curing process, or a combination thereof.

In some other embodiments, the bottom light shielding layer 402 and the top light shielding layer 404 may include the same material, such as a thermal curing material. In these embodiments, the material of the bottom light shielding layer 402 can be coated on the substrate 100, and then a first thermal treatment is performed on the bottom light shielding layer 402 before coating the material of the top light shielding layer 404. Then, a second thermal treatment is performed after coating the material of the top light shielding layer 404. Accordingly, the bottom light shielding layer 402 is subjected to one more thermal treatment, which causes the hardness of the bottom light shielding layer 402 greater than the hardness of the top light shielding layer 404. In some embodiments, the first thermal treatment and/or the second thermal treatment are/is performed at a temperature in a range between about 100° C. and about 200° C.; for example, about 150° C. In some embodiments, the first thermal treatment and/or the second thermal treatment are/is performed at a duration time in a range between about 60 minutes and about 120 minutes; for example, about 90 minutes. Also, in some embodiments, the thermal treatments as described above may include a baking process.

In some embodiments, as shown in FIG. 1B, a distance S1 between the bottom surface of the top light shielding layer 404 and the top surface of the transparent pillars 300 is in a range between about 50 µm and about 250 µm.

Next, as shown in FIG. 1C, in some embodiments, a planarization process is performed on the light shielding layer 400 to remove the top light shielding layer 404, thereby exposing the top surfaces of the transparent pillars 300. In some embodiments, the planarization process includes a CMP process, a grinding process, another suitable process, or a combination thereof. In some embodiments, the top surface of the top light shielding layer 404 is level with the top surfaces of the transparent pillars 300 after performing the planarization process, as shown in FIG. 1C. In some embodiments, after performing the planarization process and before performing a reliability test, a third thermal treatment can be performed on the light shielding layer 400 to form a semiconductor device with better reliability. In some embodiments, if the bottom light shielding layer 402 and the top light shielding layer 404 include different materials, the bottom light shielding layer 402 and the top light shielding layer 404 still have different hardness after performing the third thermal treatment. In some other embodiments, if the bottom light shielding layer 402 and the top light shielding layer 404 include the same materials, the bottom light shielding layer 402 and the top light shielding layer 404 have the same hardness after performing the third thermal treatment. In some embodiments, the third thermal treatment is performed at a temperature in a range between about 100° C. and about 200° C.; for example, about 150° C. In some embodiments, the third thermal treatment is performed at a duration time in a range between about 60 minutes and about 120 minutes; for example, about 90 minutes. Also, in some embodiments, the third thermal treatment as described above may include a baking process.

In some embodiments, the substrate 100 is thinned by performing a backside thinning process on the bottom surface of the substrate 100. The backside thinning process may include a CMP process, a grinding process, another suitable process, or a combination thereof. Thus, a substrate 100' is formed after performing the backside thinning process.

As mentioned above, the transparent pillars 300 on the sensing pixels 202 and the light shielding layer 400 between the transparent pillars 300 together form a light collimating layer 600. The function of the light collimating layer 600 is to collimate light and reduce power loss caused by light divergence. In some embodiments, other optical elements, such as color filters, glass, or microlenses (not shown), may be disposed on the light collimating layer. In some embodiments, the incident light passes through the optical elements above the light collimating layer 600 and through the light collimating layer 600 to illuminate the sensing pixels 202.

In some embodiments, a hard cover (not shown) can be disposed above the light collimating layer 600. The hard cover may include a rigid transparent material, such as calcium aluminosilicate glass, soda lime glass, sapphire, transparent polymer, or another suitable material, thereby allowing penetration of at least parts of the incident light and light illumination at the sensing pixels 202. Also, the hard cover can protect the semiconductor device 10 and other elements under the hard cover.

According to the aforementioned embodiments, the light shielding layer 400 between the transparent pillars 300 can be formed as a multi-layer structure having different hardness, thereby preventing the collapses of the transparent pillars 300 if the light shielding layer is too soft, and also preventing the cracks on the surface of the light shielding layer 400. Thus, the reliability of the semiconductor device and yield of production can be significantly improved.

Figure 2A:
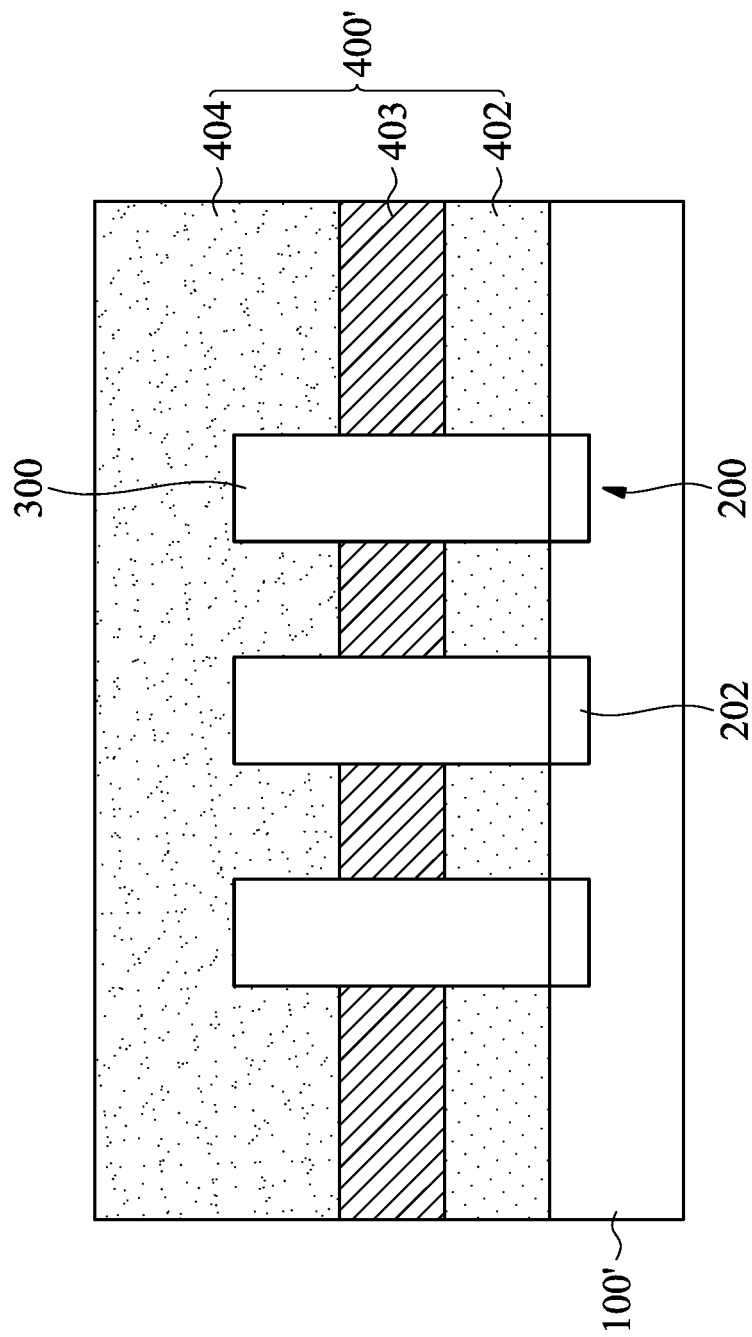
FIG. 2A to FIG. 2B are cross-sectional views illustrating intermediate stages of an exemplary method for forming the semiconductor device 20 of FIG. 2B in accordance with some embodiments.
Figure 2B:
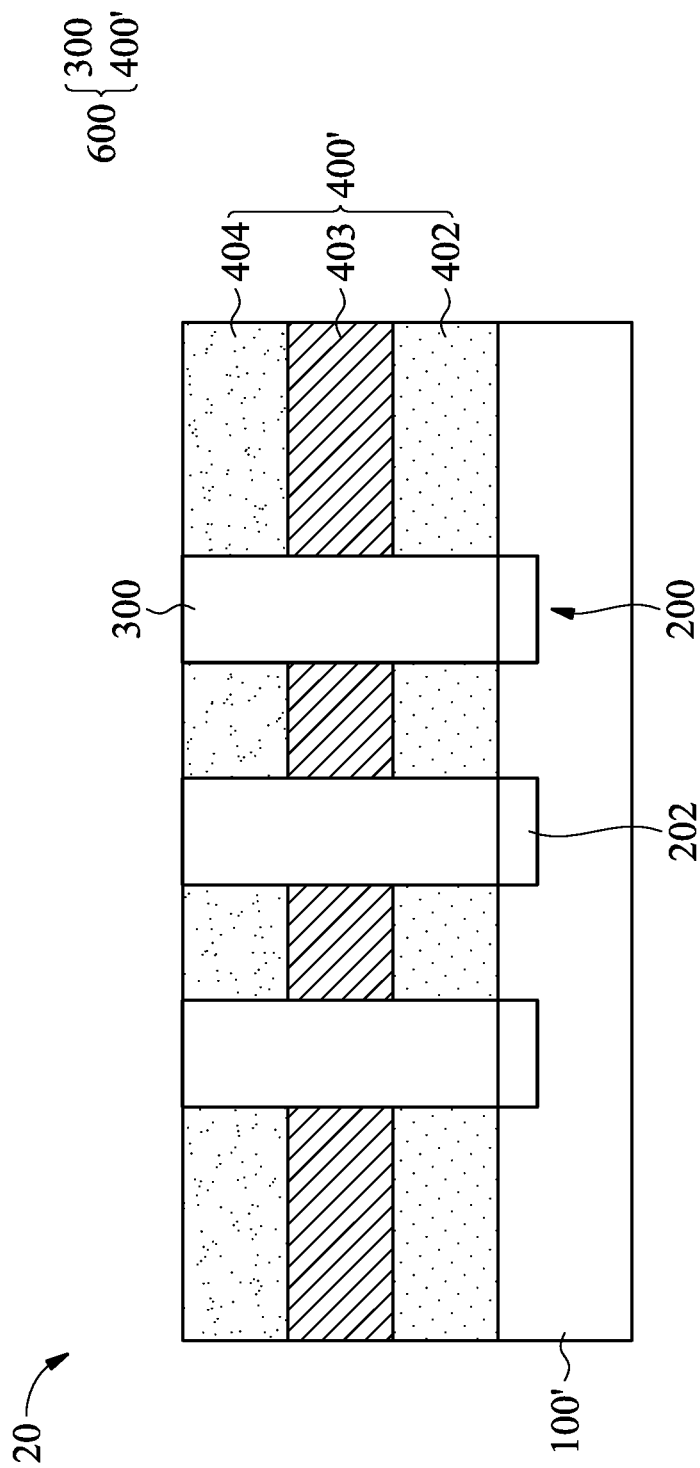

FIG. 2A to FIG. 2B are cross-sectional views illustrating intermediate stages of an exemplary method for forming the semiconductor device 20 of FIG. 2B in accordance with some embodiments. For the sake of clarity, elements and processes that are the same or similar will be given the same reference numbers. For the purpose of brevity, the descriptions of these processes and devices are not repeated herein.

In the embodiments shown in FIG. 2A to FIG. 2B, the method for forming the semiconductor device 20 is similar to the method for forming the semiconductor device 10, except that the light shielding layer 400' further includes a middle light shielding layer 403.

As shown in FIG. 2A, a structure similar to the structure of FIG. 1A is formed. Next, a bottom light shielding layer 402, a middle light shielding layer 403 and a top light shielding layer 404 are sequentially formed on the substrate 100 for forming a light shielding layer 400'. The bottom light shielding layer 402, the middle light shielding layer 403 and the top light shielding layer 404 fill spaces between the transparent pillars 300, and the top light shielding layer 404 covers the top surfaces of the transparent pillars 300. In this embodiment, the mechanical properties of the light shielding layer 400' can be adjusted more flexibly since the light shielding layer 400' has more films/layers.

In this embodiment, the middle light shielding layer 403 may include a different material than the bottom light shielding layer 402 and the top light shielding layer 404, which forms a light shielding layer 400' with alternating rigid and soft layers. In one example, the hardness of the middle light shielding layer 403 is greater than the hardness of the bottom light shielding layer 402 and is also greater than the hardness of the top light shielding layer 404; therefore, the film layers of the light shielding layer 400' have a hardness change presented as a soft layer, a hard layer and a soft layer (e.g. "soft-hard-soft"). Alternatively, in another example, the hardness of the middle light shielding layer 403 is less than the hardness of the bottom light shielding layer 402 and is also less than the hardness of the top light shielding layer 404; therefore, the film layers of the light shielding layer 400' have a hardness change presented as a hard layer, a soft layer and a hard layer (e.g. "hard-soft-hard").

In some embodiment, the process and material for forming the middle light shielding layer 403 in FIG. 2A can be similar to the process and material for forming the bottom light shielding layer 402 and the top light shielding layer 404 in FIG. 1B as described above, and the details are not repeated herein. Although FIG. 2A merely illustrates a middle light shielding layer 403 in the light shielding layer 400' of the semiconductor device 20, the disclosure is not limited thereto. The number of film layers in the light shielding layer can be adjusted to achieve the desired properties of the actual finished product.

Next, as shown in FIG. 2B, in some embodiments, a planarization process is performed on the light shielding layer 400' to planarize the top light shielding layer 404, thereby exposing the top surfaces of the transparent pillars 300. In some embodiments, the top surface of the top light shielding layer 404 is level with the top surfaces of the transparent pillars 300 after performing the planarization process. As mentioned above, the transparent pillars 300 on the sensing pixels 202 and the light shielding layer 400' between the transparent pillars 300 together form a light collimating layer 600. In some embodiments, the process for planarizing the light shielding layer 400' in FIG. 2B can be similar to the process for planarizing the light shielding layer 400 in FIG. 1C as described above, and the details are not repeated herein.

As mentioned above, after performing the planarization process and before performing a reliability test, a thermal treatment can be performed on the light shielding layer 400' to improve the reliability of the semiconductor device as manufactured. This thermal treatment is similar to the third thermal treatment as described above, and the details are not repeated herein. Also, in this exemplified embodiment, since the middle light shielding layer 403 includes a different material than the bottom light shielding layer 402 and the top light shielding layer 404, the light shielding layer 400' having rigid and soft layers arranged alternately is formed after the thermal treatment has been performed.

According to the aforementioned embodiments, the mechanical properties of the light shielding layer can be adjusted more flexibly by additionally forming a middle light shielding layer in the light shielding layer.

As shown in FIG. 1C, the semiconductor device 10 includes a substrate 100, a sensing pixel array 200 in the substrate 100, and several transparent pillars 300 over the substrate 100. The sensing pixel array 200 includes several sensing pixels 202, and each of the transparent pillars 300 is correspondingly disposed on one of the sensing pixels 202 of the sensing pixel array 200. The semiconductor device 10 further includes a light shielding layer 400 over the substrate 100 and between the transparent pillars 300, wherein the light shielding layer 400 is a multi-layer structure. In some embodiments, the hardness of the light shielding layer 400 is greater than the hardness of the transparent pillars 300, so that the light shielding layer 400 protects the transparent pillars 300 from damage during subsequent processing.

In some embodiments, the light shielding layer 400 includes the bottom light shielding layer 402 and the top light shielding layer 404. The bottom light shielding layer 402 and the top light shielding layer 404 of the light shielding layer 400 as formed have different hardness. In this embodiment, the light shielding layer 400 filling the spaces between the transparent pillars 300 is configured as a multi-layer structure including several film layers having different hardness, thereby solving the problem of collapse (caused by the light shielding layer being too soft) or cracks forming on the surface of the light shielding layer 400 (caused by the light shielding layer being too rigid) after the planarization process is performed. Thus, the reliability of the semiconductor device and yield of production can be significantly improved.

In some other embodiments, a light shielding layer of a semiconductor device (such as the light shielding layer 400' of the semiconductor device 20) may further include a middle light shielding layer 403 disposed between the bottom light shielding layer 402 and the top light shielding layer 404. In this embodiment, the mechanical properties of the light shielding layer 400' can be adjusted more flexibly since the light shielding layer 400' has more films/layers. In some embodiments, the hardness of the middle light shielding layer 403 is less than the hardness of the bottom light shielding layer 402, and is also less than the hardness of the top light shielding layer 404. Alternatively, in some embodiments, the hardness of the middle light shielding layer 403 is greater than the hardness of the bottom light shielding layer 404, and is also greater than the hardness of the top light shielding layer 402.

In summary, the embodiments of the present disclosure provide a light shielding layer filling the spaces between the transparent pillars and being configured as a multi-layer structure including several film layers having different hardness. Thus, the disclosure solves the collapsing problem (caused by the light shielding layer being too soft) and prevents cracks on the surface of the light shielding layer (caused by the light shielding layer being too rigid) after the planarization process is performed. Thus, according to some embodiments, the reliability of the semiconductor device and yield of production can be significantly improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a sensor pixel array in a substrate, wherein the sensor pixel array comprises a plurality of sensor pixels;
    forming a plurality of transparent pillars over the substrate, wherein each of the plurality of transparent pillars is correspondingly disposed on and directly contacts one of the plurality of sensor pixels of the sensor pixel array;
    forming a light shielding layer over the substrate to cover the transparent pillars, wherein the light shielding layer is a multi-layer structure comprising:
        a bottom light shielding layer on the substrate, wherein the bottom light shielding layer uncovers upper portions of lateral surfaces of the transparent pillars, and the bottom light shielding layer fills spaces between the substrate and lower portions of the lateral surfaces of the transparent pillars; and
        a top light shielding layer on the bottom light shielding layer; and
    performing a planarization process to expose top surfaces of the transparent pillars.

2. The method for forming the semiconductor device as claimed in claim 1, wherein a hardness of the light shielding layer is greater than a hardness of the plurality of transparent pillars.

3. The method for forming the semiconductor device as claimed in claim 1, wherein forming the light shielding layer comprises:
forming the bottom light shielding layer over the substrate; and
forming the top light shielding layer on the bottom light shielding layer, wherein the top light shielding layer covers upper portions of the lateral surfaces of the plurality of transparent pillars and fills spaces between the upper portions of the lateral surfaces of the transparent pillars, and the top light shielding layer covers top surfaces of the plurality of transparent pillars.

4. The method for forming the semiconductor device as claimed in claim 3, wherein forming the light shielding layer further comprises forming a middle light shielding layer between the top light shielding layer and the bottom light shielding layer.

5. The method for forming the semiconductor device as claimed in claim 4, wherein a hardness of the middle light shielding layer is less than a hardness of the top light shielding layer, and is also less than a hardness of the bottom light shielding layer.

6. The method for forming the semiconductor device as claimed in claim 4, wherein a hardness of the middle light shielding layer is greater than a hardness of the top light shielding layer, and is also greater than a hardness of the bottom light shielding layer.

7. The method for forming the semiconductor device as claimed in claim 1, wherein a distance between a bottom surface of the top light shielding layer and top surfaces of the plurality of transparent pillars is in a range between about 1 μm and about 200 μm before performing the planarization process, and a top surface of the top light shielding layer is leveled with the top surfaces of the plurality of transparent pillars after performing the planarization process.

8. The method for forming the semiconductor device as claimed in claim 1, wherein the top light shielding layer and the bottom light shielding layer as formed have different hardness during formation of the light shielding layer.

9. The method for forming the semiconductor device as claimed in claim 8, wherein the top light shielding layer and the bottom light shielding layer are made of different materials.

10. The method for forming the semiconductor device as claimed in claim 8, wherein the top light shielding layer and the bottom light shielding layer are made of the same material.

11. The method for forming the semiconductor device as claimed in claim 10, wherein a first thermal treatment is performed on the bottom light shielding layer after forming the bottom light shielding layer and before forming the top light shielding layer; and
a second thermal treatment is performed on the top light shielding layer and the bottom light shielding layer after forming the top light shielding layer.

12. The method for forming the semiconductor device as claimed in claim 11, wherein a third thermal treatment is performed on the top light shielding layer and the bottom light shielding layer after performing the planarization process, wherein the top light shielding layer and the bottom light shielding layer have the same hardness after performing the third thermal treatment.

13. A semiconductor device, comprising:
a sensing pixel array in a substrate, wherein the sensing pixel array comprises a plurality of sensing pixels;
a plurality of transparent pillars over the substrate, wherein each of the plurality of transparent pillars is correspondingly disposed on and directly contacts one of the plurality of sensing pixels of the sensing pixel array, and each of the plurality of transparent pillars has a continuous lateral surface; and
a light shielding layer over the substrate and between the plurality of transparent pillars, wherein the light shielding layer is a multi-layer structure comprising:
a bottom light shielding layer on the substrate, wherein the bottom light shielding layer uncovers upper portions of the continuous lateral surfaces of the transparent pillars, and the bottom light shielding layer directly contacts lower portions of the continuous lateral surfaces of the transparent pillars and fills spaces between the substrate and the lower portions of the continuous lateral surfaces of the transparent pillars;
a top light shielding layer on the bottom light shielding layer, and the top light shielding layer directly contacting and covering the upper portions of the continuous lateral surfaces of the plurality of transparent pillars, wherein a hardness of the top light shielding layer is different from a hardness of the bottom light shielding layer; and
a middle light shielding layer disposed between the top light shielding layer and the bottom light shielding layer, wherein a hardness of the middle light shielding layer is different from the hardness of the top light shielding layer, and is also different from the hardness of the bottom light shielding layer.

14. The semiconductor device as claimed in claim 13, wherein a hardness of the light shielding layer is greater than a hardness of the plurality of transparent pillars.

15. The semiconductor device as claimed in claim 13, wherein the top light shielding layer fills spaces between the upper portions of the continuous lateral surfaces of the transparent pillars, and a top surface of the top light shielding layer is leveled with top surfaces of the plurality of transparent pillars.

16. The semiconductor device as claimed in claim 13, wherein a thickness of the top light shielding layer is in a range between about 1 μm and about 200 μm.

17. The semiconductor device as claimed in claim 13, wherein the top light shielding layer and the bottom light shielding layer are made of different materials.

18. The semiconductor device as claimed in claim 13, wherein the hardness of the middle light shielding layer is less than the hardness of the top light shielding layer, and is also less than the hardness of the bottom light shielding layer.

19. The semiconductor device as claimed in claim 13, wherein the hardness of the middle light shielding layer is greater than the hardness of the top light shielding layer, and is also greater than the hardness of the bottom light shielding layer.

* * * * *